United States Patent
Kobayashi

(10) Patent No.: US 6,943,435 B2
(45) Date of Patent: Sep. 13, 2005

(54) LEAD PIN WITH AU-GE BASED BRAZING MATERIAL

(75) Inventor: Masaru Kobayashi, Kanagawa (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 10/338,735

(22) Filed: Jan. 9, 2003

(65) Prior Publication Data

US 2003/0141602 A1 Jul. 31, 2003

(30) Foreign Application Priority Data

Jan. 30, 2002 (JP) .......................... 2002-022171

(51) Int. Cl.⁷ .............................................. H01L 23/495
(52) U.S. Cl. ...................... 257/673; 257/674; 257/677; 257/767
(58) Field of Search ................................ 257/674, 677, 257/673, 772, 771, 767, 742, 750, 780, 781, 697, 779, 666

(56) References Cited

U.S. PATENT DOCUMENTS

| | | |
|---|---|---|
| 3,941,916 A | 3/1976 | Morse |
| 5,442,145 A | 8/1995 | Imai et al. |
| 6,268,017 B1 * | 7/2001 | Takeuchi et al. ............. 427/125 |
| 6,359,332 B2 * | 3/2002 | Shiraishi ...................... 257/697 |
| 2001/0015491 A1 * | 8/2001 | Shiraishi |

FOREIGN PATENT DOCUMENTS

| | | |
|---|---|---|
| JP | 62-113457 A | 5/1987 |
| JP | 04-273468 A | 9/1992 |
| WO | WO 89/04740 A1 | 6/1989 |

* cited by examiner

Primary Examiner—Donghee Kang
(74) Attorney, Agent, or Firm—Rothwell, Figg, Ernst & Manbeck, P.C.

(57) ABSTRACT

A lead pin with an Au—Ge based brazing material including a lead pin made of a copper-containing metal is provided. The lead pin including a joining surface to a substrate, at least the joining surface of the lead pin being plated with nickel and gold, and including an Au—Ge based brazing material being fused on top of the gold plating, wherein the lead pin after plated with nickel is subjected to heat-treatment and then plated with gold to fuse the brazing material.

11 Claims, 1 Drawing Sheet

LEAD PIN WITH AU-GE BASED BRAZING MATERIAL

BACKGROUND OF THE INVENTION

1. Field of the Invention

The present invention relates to a lead pin with a brazing material fused at a joining surface to a substrate, and in particular, relates to a lead pin with an Au—Ge based brazing material fused at the joining surface.

2. Description of the Related Art

A lead pin which is a conductor member for various electronic components and circuit boards is supplied in the form having a brazing material fused at a head (joining part) of the lead pin, and served for joining components or substrates. A lead pin including a copper-containing alloy such as a copper-iron alloy is typically used, while an Au—Sn (for example, Au-20% by weight of Sn) brazing material is widely used at present as a material for a brazing material. In the manufacture of electronic circuits and electronic equipment, stepwise processes are generally applied, in which assembly of the electronic components or circuit boards are performed by joining lead pins and the like, and then they are assembled by means of soldering. For the stepwise processes, a plurality of brazing materials having different melting points are required. The Au—Sn based brazing material has a melting point of from 280 to 300° C., which is a medium melting point higher than that of the solder (melting point of from 180 to 230° C.) to be used in subsequent assembling processes, and is suitable as a brazing material which will not melt the brazed portion of the components during the assembling process. The Au—Sn based brazing material has been widely used owing to its medium melting point.

The lead pin with a conventional brazing material is manufactured by plating the head of the lead pin with nickel as an undercoat, then plating it with gold, placing the brazing material on top of the gold plating and fusing it. The area for fusing the brazing material is plated with gold, since a eutectic brazing material such as the Au—Sn based brazing material has poor wettablity and poorly flows on a joining surface when melted, so that the flow of the brazing material is improved by the preliminary gold plating on the joining surface in advance.

Application of an Au—Ge based brazing material (Au-12 to 13% by weight of Ge) as a brazing material for the lead pin with a brazing material has recently been studied. This comes from signs of a transition in the kinds of solders used for the manufacture of electronic equipment due to recent concern to environmental issues, that is, a conventional solder (Pb—Sn type) having been replaced by a lead free solder (Sn—Ag type or Sn—Zn type). The lead free solder has a little higher melting point (200 to 300° C.) than a conventional solder, so that use of a brazing material having a higher melting point is considered to be suitable in a joining process of a lead pin, which is an upstream step of soldering. The Au—Ge based brazing material is regarded as a suitable brazing material for a lead pin as it has a melting point of about 360° C. which is a little higher than that of the Au—Sn based brazing material.

The inventors have studied the lead pin in which an Au—Ge based brazing material is fused to the lead pin through a conventional method and found that the joining strength between the brazing material and the lead pin body could not sufficiently be ensured and could result in peeling of the brazing material. The peeling of the brazing material tends to occur by applying impact to the lead pin. Such a low joining strength causes decrease in operation efficiency in the joining of a lead pin, and may cause drop-off of the lead pin from a substrate after the joining.

The present invention has been created under the above background, and it is an object of the present invention to provide a lead pin with an Au—Ge based brazing material in which the brazing material is not peeled even by impact.

SUMMARY OF THE INVENTION

Figure 1:
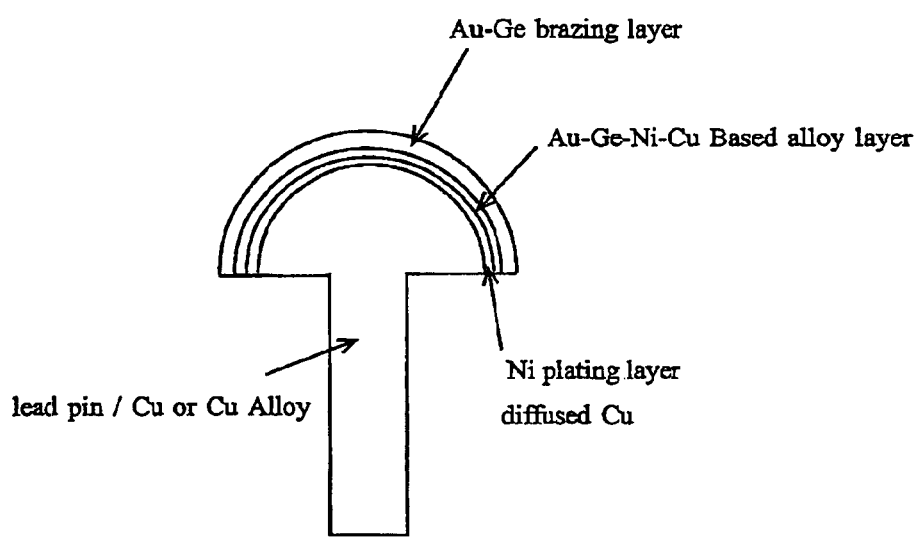
FIG. 1 is a schematic cross-section view of a lead pin according to this invention.

As described above, the joining surface of a conventional lead pin is first plated with nickel and gold, and then a brazing material is fused on top of it. In the lead pin after the brazing material is fused, a gold plated layer is integrated with the brazing material by forming an alloy during the process in which the brazing material melts and solidifies. A nickel plated layer which is an undercoat layer of the gold plating remains at the boundary between the brazing material and the lead pin. It is considered that an Au—Sn—Ni alloy is formed around the boundary, which contains nickel diffused a little during the fusing of the brazing material, in addition to gold and tin which are components of the brazing material.

On the other hand, also when an Au—Ge based brazing material is applied, it is considered that gold plating is integrated with a brazing material during the fusing of the brazing material and a nickel plated layer remains at a boundary between the lead pin and the brazing material. Therefore, when the Au—Ge based brazing material is applied, the composition of the brazing material around the boundary is considered to be in the form of an alloy of an Au—Ge—Ni type.

In consideration of the fact that the composition around a boundary between a lead pin and a brazing material is different by the difference of the brazing material to be applied, a low joining strength between the Au—Ge—Ni alloy present around the boundary and the nickel plated layer is considered to be a factor of the reduction of the joining strength in the case of applying the Au—Ge based brazing material.

The inventors have considered that adjustment of the composition at the boundary between the lead pin and the brazing material is required for improving the joining strength of the Au—Ge based brazing material to the lead pin, and discovered a method for fusing the brazing material after a diligent study of the means for providing a suitable composition around the boundary between the lead pin and the brazing material. The method includes plating the lead pin with nickel, then heat-treating the lead pin, thereby causing copper in the lead pin to be diffused into the nickel plated layer, plating the top of the layer with gold and fusing the brazing material. By this method, the copper diffused into the nickel plated layer diffuses into the brazing material during the fusing of the brazing material to form an Au—Ge—Ni—Cu quaternary alloy, which ensures a sufficient joining strength.

The present invention comprises a lead pin with an Au—Ge based brazing material comprising a lead pin made of a metal containing copper, the lead pin comprising a joining surface to a substrate, at least the joining surface of the lead pin being plated with nickel and gold, and comprising an Au—Ge based brazing material being fused on top of the gold plating, wherein the lead pin after plated with nickel is subjected to heat-treatment and then plated with gold to fuse the brazing material.

The detail reason is not clear why the joining strength is improved by diffusing copper at the boundary between the lead pin and the brazing material. The inventors estimate that the joining properties to nickel plating is improved by adding copper to the Au—Ge—Ni alloy around the boundary of the brazing material, since copper is basically a metal having good joining properties to nickel plating.

The conditions for the heat-treatment carried out after the nickel plating for diffusing copper in the lead pin should not be limited if the temperature and time are sufficient to enable diffusion and movement of copper atoms. Copper can be diffused at a temperature of 500° C. or higher. If the heat-treatment is only for the purpose of improving the joining strength between the lead pin and the brazing material, copper can be diffused sufficiently into a nickel layer by a high temperature and a long period of heat-treatment, thereby facilitating the diffusion of copper into the brazing material and ensuring the joining strength.

On the other hand, in consideration of the properties of the brazing material after the lead pin is fused to a substrate in addition to the joining strength between the lead pin and the brazing material, the concentration of copper in the brazing material is preferably low, because the mixing of copper into a gold brazing material including the Au—Ge type generally could reduce the corrosion resistance of the brazing material. The present invention comprises diffusing copper in the lead pin into the brazing material, but the quantity of the diffused copper is preferably as small as possible in consideration of the properties of the brazing material. The diffused copper may preferably be minimum in quantity so that the copper is supplied only to the boundary between the brazing material and the lead pin during the fusing of the brazing material. After studying the heat-treatment conditions for diffusing such a very small quantity of copper into a nickel plated layer, the inventors found that the heat-treatment at 500 to 600° C. for 15 to 40 minutes was appropriate. Within this range of the heat-treatment conditions, copper is diffused into the nickel layer only in a very small quantity, and the diffusion of copper at the fusing of the brazing material stops around the boundary between the lead pin and the brazing material, preventing copper from diffusing into the whole of the brazing material.

According to the present invention, a brazing material will not be peeled off a lead pin even if impact is applied. Consequently, the operation efficiency during an operation for attaching a lead pin will not be impaired, and the possibility of producing defective items may be remarkably reduced. In addition, the corrosion resistance of the brazing material maybe ensured, since copper will not diffuse into the whole of the brazing material by adjusting the heat-treatment conditions after the nickel plating.

The thickness of the nickel plating on the lead pin is preferably from 1.0 to 4.0 $\mu$m. When the thickness is 1.0 $\mu$m or less, the quantity of the diffused copper into the plating increases even when heat-treated at a low temperature, and the quantity of the diffused copper into the brazing material also increases. When the thickness is 4.0 $\mu$m or more, the diffusion of copper will become too small to ensure sufficient joining strength of the brazing material.

The thickness of the gold plating before the fusing of the brazing material is preferably from 0.5 to 1.5 $\mu$m. As described above, the gold plating is for the purpose of ensuring wettability of the brazing material at the fusing of the brazing material, and a thickness of about 0.5 $\mu$m is required for this purpose. On the other hand, the wettability will be maintained with the gold plating having a thickness of 1.5 $\mu$m or more, and too thick gold plating could be costly.

These nickel and gold plating are needed to be applied at least on a joining surface, but they may be applied on the whole of the lead pin. Since the lead pin is a member having a very small size, it will be difficult to plate only on the joining surface. The method of plating may be either electrolytic plating or electroless plating, but electrolytic barrel plating is preferable for obtaining uniform plating without unevenness.

The composition of the Au—Ge based brazing material s applicable to the present invention is not limited, but the materials within the range of the composition which is conventionally known as Au—Ge based brazing materials are also applicable.

DETAILED DESCRIPTION OF THE PREFERRED EMBODIMENTS

Suitable examples of the present invention will now be described together with a comparative example.

EXAMPLE 1

(Preparation of a Brazing Material)

An Au-12.5% by weight of Ge brazing material was first prepared as an Au—Ge based brazing material. Gold and germanium were melted in a predetermined weight ratio under vacuum in a crucible, and the resultant liquid was caused to flow from nozzles provided at the bottom of the crucible to be atomized to a brazing material in the form of particles.

(Nickel Plating on a Lead Pin)

The lead pin used in the present Example is made of ALLOY 194 (Cu—Fe alloy). The lead pin was first plated with nickel. The nickel plating was carried out with an electrolytic plating method, and the thickness of the plating was 1.5 $\mu$m.

(Heat-Treatment)

Next, the lead pin after the nickel plating was subjected to heat-treatment by heating in an electric furnace at 650° C. for 20 minutes.

(Gold Plating)

The lead pin after the heat-treatment was plated with gold. The gold plating was carried out first by strike plating, and then by an electrolytic barrel method. The thickness of the gold plating was 1.0 $\mu$m.

(Fusing of the Brazing Material)

The Au—Ge based brazing material prepared as above was fused to the lead pin after the above processes. The fusing of the brazing material was carried out by fixing the lead pin with a carbon jig, placing the brazing material in the form of particles on the head of the lead pin, inserting the lead pin into an electric furnace together with the carbon jig, and heating at 400° C. for one to two minutes.

EXAMPLE 2

A lead pin was plated with nickel according to a process similar to the counterparts in Example 1, and then heat-treated under the condition of 550° C. and 20 minutes. Other conditions are similar to Example 1.

COMPARATIVE EXAMPLE

An Au—Ge based brazing material was fused according to a method similar to the method for producing a conventional lead pin with an Au—Sn based brazing material. The lead pin was nickel plated according to a process similar to that in Example 1 and subjected to gold plating and fusing of the brazing material without heat-treatment. Materials and conditions used were the same as those for Example 1. Strength Test: The three kinds of lead pins with a brazing material produced as above were tested for examining the joining strength at a joining part of the brazing material. The lead pin with a brazing material was held tight with pincers at a brazing material part and at a pin part (foot part) of a lead pin respectively, fixed and subjected to a tensile test. The joining strength was evaluated by examining the area of break (whether the lead pin breaks or the brazing material is peeled). The results are shown in Table 1.

TABLE 1

|  | Broken Area |
| --- | --- |
| Example 1 | Lead pin broke |
| Example 2 | Lead pin broke |
| Comparative Example 1 | Brazing material peeled |

The lead pins according to Examples 1 and 2 broke at the lead pin part due to tension, and the brazing material was peeled off the lead pin of Comparative Example 1. These results indicate that the joining strengths of the brazing material in the lead pins according to Examples 1 and 2 are higher than the tensile strength of the lead pin itself. Consequently, it is considered that the peeling of the brazing material will not occur upon application of impact in the lead pins according to the present Examples.

The lead pins with a brazing material according to Examples 1 and 2 were then analyzed by use of EPMA (Electron Probe Micro Analysis) for studying copper contents in the nickel plating layer and the brazing material. The presence of each element of Au, Ge, Ni and Cu was confirmed around the boundary between the lead pin and the brazing material for both of the lead pins with a brazing material according to Examples 1 and 2. In addition, with regard to the presence or absence of copper in the brazing material, the presence of 7% by weight of copper in a central part of the brazing material and its neighborhood were confirmed in the lead pin according to Example 1, while no copper was detected in the brazing material for the lead pin according to Example 2. Thus, it was confirmed that when the heat-treatment temperature is relatively high (650° C.), copper in the lead pin finally diffuses also into a brazing material. The lead pin according to Example 1 is considered to have sufficient joining strength with a brazing material, but to be little poor in corrosive resistance.

As can be understood from these Examples, the lead pin according to the present invention comprises an Au—Ge based brazing material as a brazing material, and different from the one according to a conventional method, the brazing material will not be peeled off the lead pin even if impact is applied. According to the present invention, the operation efficiency during an operation for attaching a lead pin to electronic components will not be impaired, and the possibility of producing defective items can be reduced.

What is claimed is:

1. A lead pin with an Au—Ge based brazed material comprising a lead pin made of a metal-containing copper, the lead pin comprising a joining surface to a substrate, at least the joining surface of the lead pin comprising a nickel plating layer, an Au—Ge brazed layer fused on top of the nickel plating layer, and an Au—Ge—Ni—Cu based alloy layer at the boundary between the nickel-plating layer and the Au—Ge brazed layer, wherein the lead pin after being plated with nickel but before being brazed with Au—Ge is subjected to heat-treatment to cause the copper to diffuse into and through the nickel plating layer.

2. The lead pin with an Au—Ge based brazing material according to claim 1, wherein the heat-treatment of the lead pin after being plated with nickel is carried out at a temperature of from 500 to 600° C. and for a heating period of from 15 to 40 minutes.

3. The lead pin with an Au—Ge based brazing material according to claim 1, wherein the thickness of the nickel plating is from 1.0 to 4.0 µm.

4. The lead pin according to claim 1, wherein the lead pin has a transitional gold plating layer overlying the nickel plating layer, with at least most of the transitional gold plating layer becoming integrated with the Au—Ge brazed layer when the Au—Ge brazed layer is applied to the lead pin.

5. A lead pin for use as a conductor member, the lead pin formed from a copper alloy and at least a joining surface of the lead pin comprising:

(a) a nickel plating layer;

(b) a gold-germanium alloy brazed layer over the nickel plating layer; and (c) a gold-germanium-nickel-copper quaternary alloy at the interface of the nickel plating layer and the gold-germanium alloy brazed layer, wherein a heat-treatment is carried out on the lead pin in order to cause the diffusion of the copper into and through the nickel plating layer.

6. The lead pin of claim 5, wherein the nickel plating layer has a thickness of 1.0 to 4.0 µm.

7. In a lead pin for use as a conductor member, the lead pin containing copper as a base component, a nickel plating layer as a joining surface, and an Au—Ge brazed layer, the improvement comprising:

improving the joining strength of the lead pin by the presence of copper diffused into and through the nickel plating layer, and an Au—Ge—Ni—Cu based alloy layer at the boundary between the nickel plating layer and the Au—Ge brazed layer.

8. The lead pin according to claim 7, wherein copper is caused to diffuse into and through the nickel plating layer by subjecting the lead pin to heat treatment after plating the nickel plating layer onto the lead pin but before brazing the Au—Ge brazed layer onto the lead pin.

9. The lead pin according to claim 8, wherein the heat treatment is carried out at a temperature of from 500 to 600° C. and for a heating period of from 15 to 40 minutes.

10. The lead pin according to claim 7, wherein the lead pin has a transitional gold plating layer overlying the nickel plating layer, with at least most of the transitional gold plating layer becoming integrated with the Au—Ge brazed layer when the Au—Ge brazed layer is applied to the lead pin.

11. The lead pin according to claim 7, wherein the thickness of the nickel plating layer is from 1.0 to 4.0 µm.

* * * * *